United States Patent
Koushan et al.

(10) Patent No.: US 11,423,990 B2
(45) Date of Patent: Aug. 23, 2022

(54) MULTI-STAGE ERASE OPERATION FOR A MEMORY DEVICE

(71) Applicant: Micron Technology, Inc., Boise, ID (US)

(72) Inventors: Foroozan S. Koushan, San Jose, CA (US); Shinji Sato, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 16/947,642

(22) Filed: Aug. 11, 2020

(65) Prior Publication Data

US 2022/0051724 A1    Feb. 17, 2022

(51) Int. Cl.
*G11C 16/14* (2006.01)
*G11C 16/04* (2006.01)
*G11C 16/08* (2006.01)
*G11C 16/32* (2006.01)

(52) U.S. Cl.
CPC .......... *G11C 16/14* (2013.01); *G11C 16/0483* (2013.01); *G11C 16/08* (2013.01); *G11C 16/32* (2013.01)

(58) Field of Classification Search
CPC ..... G11C 16/14; G11C 16/0483; G11C 16/08; G11C 16/32
See application file for complete search history.

(56) References Cited

U.S. PATENT DOCUMENTS

| 2011/0188321 A1 | 8/2011 | Kito et al. |
| 2011/0216604 A1 | 9/2011 | Mikajiri et al. |
| 2020/0411106 A1* | 12/2020 | Nam ................. G11C 16/0483 |

OTHER PUBLICATIONS

PCT International Search Report and Written Opinion for International Application No. PCT/US2021/045433 dated Nov. 30, 2021, 14 pages.

* cited by examiner

*Primary Examiner* — Jay W. Radke
(74) *Attorney, Agent, or Firm* — Lowenstein Sandler LLP

(57) ABSTRACT

Control logic in a memory device initiates an erase operation on a memory array and causes an erase voltage signal to be applied to a source terminal of a string of memory cells in a data block of the memory array during the erase operation. The control logic further causes a first voltage signal to be applied to a first select line of the data block and a second voltage signal to be applied to a second select line of the data block, wherein the first select line is coupled to a first device in the string of memory cells and the second select line is coupled to a second device in the string of memory cells, and wherein the first voltage signal and the second voltage signal both have a common first voltage offset with respect to the erase voltage signal during a first stage of the erase operation. The control logic further determines an end of the first stage of the erase operation and causes the first voltage signal to decrease to a second voltage offset with respect to the erase voltage signal and causes the second voltage signal to decrease to a third voltage offset with respect to the erase voltage signal during a second stage of the erase operation, wherein the second offset is greater than the third offset.

20 Claims, 6 Drawing Sheets

MULTI-STAGE ERASE OPERATION FOR A MEMORY DEVICE

TECHNICAL FIELD

Embodiments of the disclosure relate generally to memory sub-systems, and more specifically, relate to a multi-stage erase operation for a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
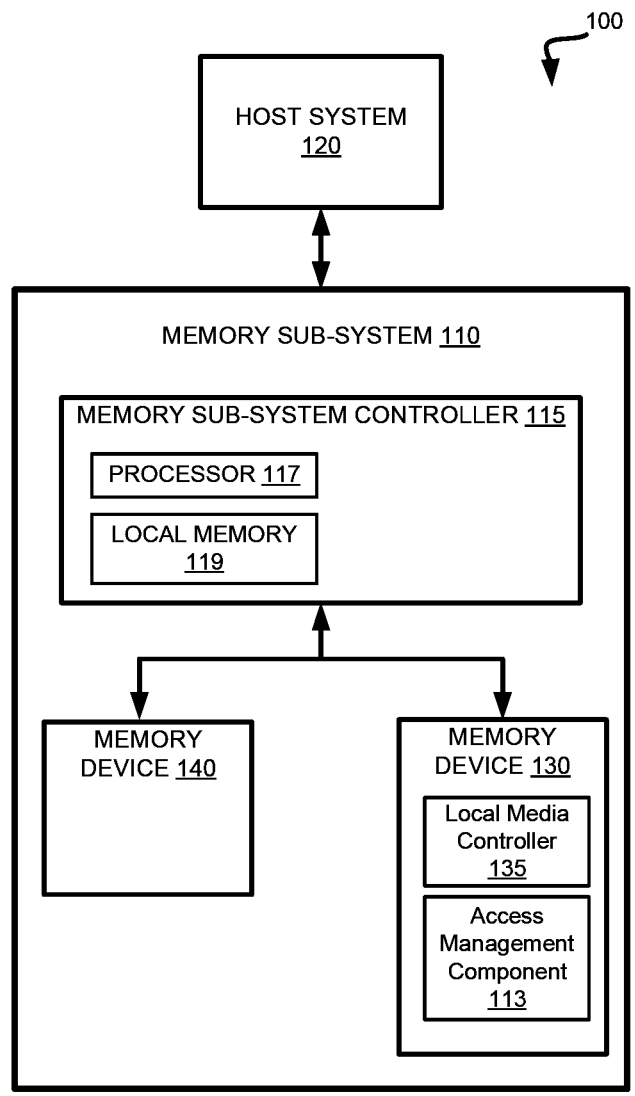
FIG. 1 illustrates an example computing system that includes a memory sub-system in accordance with some embodiments of the present disclosure.

Aspects of the present disclosure are directed to a multi-stage erase operation for a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more die, each including one or more planes. For some types of non-volatile memory devices (e.g., NAND memory), each plane includes of a set of physical blocks. Each block includes of a set of pages. Each page includes a set of memory cells ("cells"). A cell is an electronic circuit that stores information. A data block hereinafter refers to a unit of the memory device used to store data and can include a group of memory cells, a word line group, a word line, or individual memory cells. Each data block can include a number of sub-blocks, where each sub-block is defined by a set of associated pillars (e.g., vertical conductive traces) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a programming or erase operation, a selected memory cell(s) can be programmed or erased with the application of a programming or erase voltage to a corresponding selected word line. Due to the word line being common to multiple memory cells, unselected memory cells can be subject to the same programming or erase voltage as the selected memory cell(s). If not otherwise preconditioned, the unselected memory cells can experience effects from the programming or erase voltage on the common word line. These programming or erase voltage effects can include the condition of charge being stored in the unselected memory cells which are expected to maintain stored data. The programming voltage effect is termed a "programming disturbance" or "program disturb" effect. The program disturb effect can render the charge stored in the unselected memory cells unreadable altogether or, although still apparently readable, the contents of the memory cell can be read as a data value different than the intended data value stored before application of the programming voltage.

During an erase operation on a non-volatile memory device, certain devices at the source end of a memory string, such as a gate induced drain leakage (GIDL) generator (GG) device, are susceptible to a "trap-up" effect where electrons are trapped in the poly-silicon channel. The GIDL generator device's function is to generate holes during the erase operation which can flow into the poly-silicon channel to cancel out the trapped electrons there and erase the memory. The GIDL generator initially has a very low threshold voltage (e.g., a negative voltage), however, as the number of program/erase cycles performed on the memory device increases, the threshold voltage of the GIDL generator can increase (e.g., to a positive voltage due to the trap up of electrons). This increase can limit maximum endurance of the devices due to string current degradation. To avoid the increase on the threshold voltage of the GIDL generator, many devices limit the number of program/erase cycles that can be performed, which limits the overall endurance of the memory device. In addition, a higher threshold voltage of the select gate device is desirable to reduce the read-disturb effect in lower memory cells of the string, but is often not possible as the higher threshold voltage of the select gate device will lead to further trap-up in the GIDL generator. When performing an erase operation, certain devices ramp up the voltage biases at the GIDL generator and select gate devices with fixed offsets relative to the voltage bias at the source end of the memory string. Due to the characteristics of the GIDL generator described above, this approach often results in hot-electron injection at the source end of the memory string, thereby reducing the effectiveness of the erase operation.

Aspects of the present disclosure address the above and other deficiencies by implementing a multi-stage erase operation on a memory device in a memory sub-system. An access management component of the memory device can initiate an erase operation in response to a command or request from some other system components, such as a memory sub-system controller. To perform the erase operation, the access management component causes an erase voltage to be applied to a source end of a memory string, for example, allowing electrons stored in the channel region to flow out, thereby reducing the stored charge and erasing the memory. In one embodiment, during a first stage of the erase operation, the access management component causes a first voltage to be applied to a GIDL generator device at a source-end of the memory string and a second voltage to be applied to a select gate device at the source-end of the memory string. In one embodiment, the first and second voltages are the same during the first stage of the erase operation, and thus have a same first offset relative to the erase voltage (i.e., the first and second voltages both begin ramping up when the erase voltage reaches a certain level). Each of the erase voltage and the first and second voltages continue ramping up until the access management component detects the end of the first stage. A second stage of the erase operation follows, during which the access management component causes the first and second voltages to be reduced by respective amounts. As a result, the first voltage applied to the GIDL generator device has a second offset with respect to the erase voltage and the second voltage applied to the select gate device has a third offset with respect to the erase voltage. In one embodiment, the second offset between the first voltage and the erase voltage is larger than the third offset, and both the second offset and the third offset are larger than the first offset used in the first stage. Each of the erase voltage, which is not reduced, and the first and second voltages, after being reduced, continue ramping up until the access management component detects the end of the second stage. A third stage of the erase operation follows, during which the access management component causes the erase voltage and the first and second voltages to level off at a constant voltage.

Advantages of the present disclosure include, but are not limited to, improved operation of the memory device. Since both the first voltage applied to the GIDL generator device and the second voltage applied to the select gate device at the source-end of the memory string have the same first offset relative to the erase voltage at the source during the first stage of the erase operation, and since that first offset is relatively low, a relatively small electrostatic field is formed at the source-end of the memory string. The small electrostatic field results in reduced trap-up effect (i.e., fewer trapped electrons) during the first stage, and the field only increases during the second stage, thereby allowing the GIDL generator device to generate holes for the erase operation. Thus, even as the number of program/erase cycles increases, the negative trap-up effects do not impact performance in the memory device. Accordingly, significant improvements in endurance of the memory cells are realized. The implementation of the multi-stage erase scheme described herein does not require the addition of any components and thus, does not impact the device footprint or complexity. In addition, the use of the multi-stage erase operation improves reliability of the GIDL generator device and permits the select gate device to have a higher threshold voltage while allowing sufficient margin for degradation associated with temperature increases during manufacture of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LB A), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a memory device access management component 113 that can oversee, control, and/or manage data access operations, such as erase operations, performed on a non-volatile memory device, such as memory device 130, of memory sub-system 110. In one embodiment, access management component 113 initiates an erase operation on a memory array and causes an erase voltage signal to be applied to a source terminal of a string of memory cells in a data block of the memory array during the erase operation. The access management component 113 further causes a first voltage signal to be applied to a first select line of the data block and a second voltage signal to be applied to a second select line of the data block. In one embodiment, the first select line is coupled to a first device (e.g., a GIDL generator device) in the string of memory cells and the second select line is coupled to a second device (e.g., a select gate device) in the string of memory cells. In one embodiment, the first voltage signal and the second voltage signal both have a common first voltage offset with respect to the erase voltage signal during a first stage of the erase operation. The access management component 113 further determines an end of the first stage of the erase operation and causes the first voltage signal to decrease to a second voltage offset with respect to the erase voltage signal and causes the second voltage signal to decrease to a third voltage offset with respect to the erase voltage signal during a second stage of the erase operation. In one embodiment, the second offset is greater than the third offset, and both the second offset and third offset are greater than the first offset used in the first stage of the erase operation. The access management component 113 further determines an end of the second stage of the erase operation and causes the erase voltage signal, the first voltage signal, and the second voltage signal to remain at respective constant voltage levels during a third stage of the erase operation. Further details with regard to the operations of the access management component 113 are described below.

In some embodiments, the memory sub-system controller 115 includes at least a portion of access management component 113. For example, the memory sub-system controller 115 can include a processor 117 (e.g., a processing device) configured to execute instructions stored in local memory 119 for performing the operations described herein. In some embodiments, access management component 113 is part of the host system 110, an application, or an operating system. In other embodiment, local media controller 135 includes at least a portion of access management component 113 and is configured to perform the functionality described herein. In such an embodiment, access management component 113 can be implemented using hardware or as firmware, stored on memory device 130, executed by the control logic (e.g., access management component 113) to perform the operations described herein.

Figure 2:
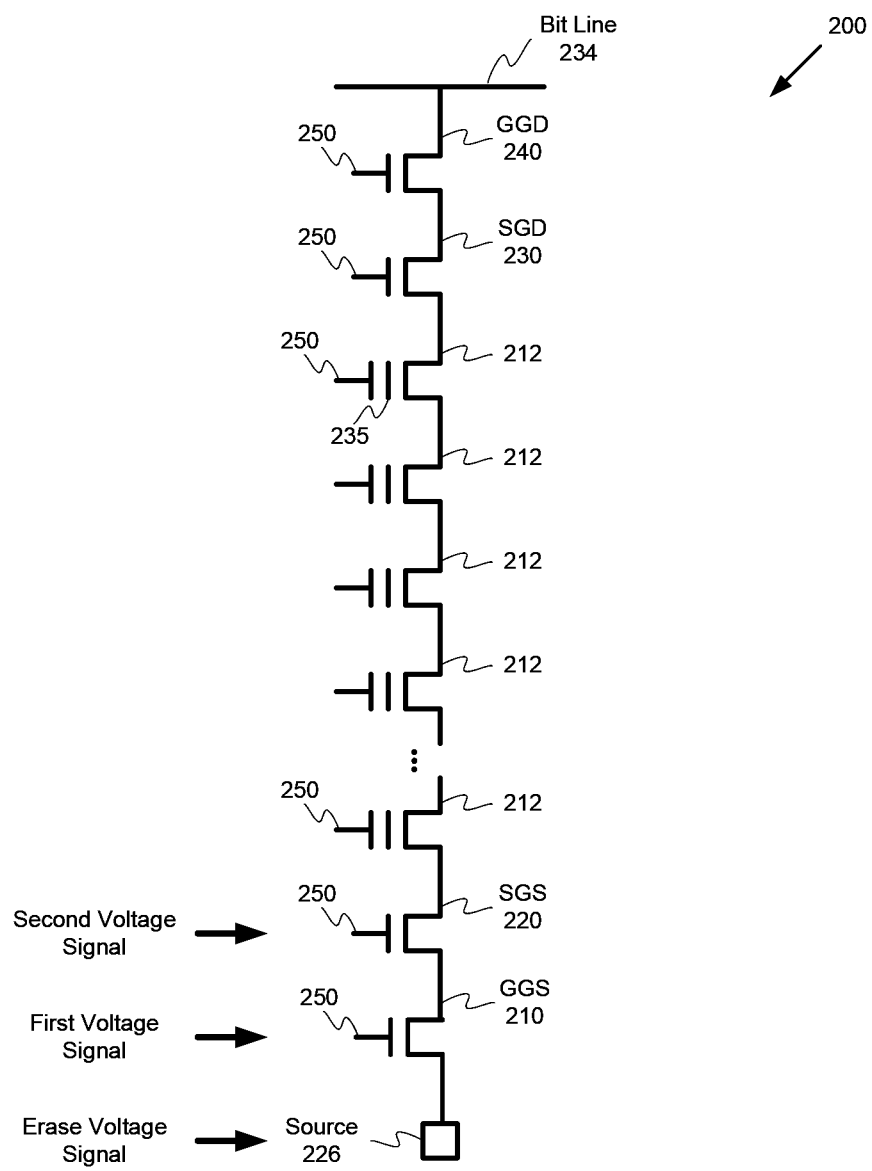
FIG. 2 is a schematic diagram illustrating a string of memory cells in a data block of a memory device in a memory sub-system in accordance with some embodiments of the present disclosure.

FIG. 2 is a schematic diagram illustrating a string 200 of memory cells in a data block of a memory device in a memory sub-system in accordance with some embodiments of the present disclosure. In one embodiment, the string 200 is representative of one portion of memory device 130. The string 200 includes a number of memory cells 212 (i.e., charge storage devices), such as up to 32 memory cells (or more) in some embodiments. The string 200 includes a source-side gate induced drain leakage (GIDL) generator 210 (GGS) (typically an n-channel transistor) and a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a drain-side GIDL generator 240 (GGD) are coupled between one of the memory cells 212 and a data line 234, which is commonly referred to in the art as a "bit line." The common source 226 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 can be controlled by signals on their respective control gates 250.

The control signals can be applied by access management component 113, or at the direction of access management component 113, to select lines (not shown) to select strings, or to access lines (not shown) to select memory cells 212, for example. In some cases, the control gates can form a portion of the select lines (for select devices) or access lines (for cells). The drain select gate 230 receives a voltage that can cause the drain select gate 230 to select or deselect the string 200. In one embodiment, each respective control gate 250 is connected to a separate word line (i.e., access line), such that each device or memory cell can be separately controlled. The string 200 can be one of multiple strings of memory cells in a block of memory cells in memory device 130. For example, when multiple strings of memory cells are present, each memory cell 212 in string 200 may be connected to a corresponding shared word line, to which a corresponding memory cell in each of the multiple strings is also connected.

In one embodiment, to perform a multi-stage erase operation, the access management component 113 causes an erase voltage signal to be applied to a source terminal (e.g., common source 226) of string 200 allowing electrons stored in the channel region to flow out, thereby reducing the stored charge and erasing the memory. In one embodiment, during a first stage of the multi-stage erase operation, the access management component 113 causes a first voltage signal to be applied to a GIDL generator device (e.g., GGS 210) at a source-end of the string 200 and a second voltage signal to be applied to a select gate device (e.g., SGS 220) at the source-end of the string 200. In one embodiment, the first and second voltage signals are the same during the first stage of the erase operation, and thus have a same first offset relative to the erase voltage signal (i.e., the first and second voltage signals both begin ramping up at the same rate when the erase voltage signal reaches a certain level). Each of the erase voltage signal and the first and second voltage signals continue ramping up until the access management component 113 detects the end of the first stage. A second stage of the multi-stage erase operation follows, during which the access management component 113 causes the first and second voltage signals to be reduced by respective amounts. As a result, the first voltage signal applied to the GIDL generator device (e.g., GGS 210) has a second offset with respect to the erase voltage signal and the second voltage signal applied to the select gate device (e.g. SGS 220) has a third offset with respect to the erase voltage signal. In one embodiment, the second offset between the first voltage signal and the erase voltage signal is larger than the third offset between the second voltage signal and the erase voltage signal, and both the second offset and the third offset are larger than the first offset used in the first stage. In other embodiments, respective voltage signals can be applied to devices at the drain-end of string 200, such as to GGD 240 and SGD 230. Depending on the embodiment, these respective voltage signals can be the same as the first and second voltage signals described above, or can be different (i.e., can have different waveforms, offsets, magnitudes, ramping rates, or other characteristics).

Figure 3:
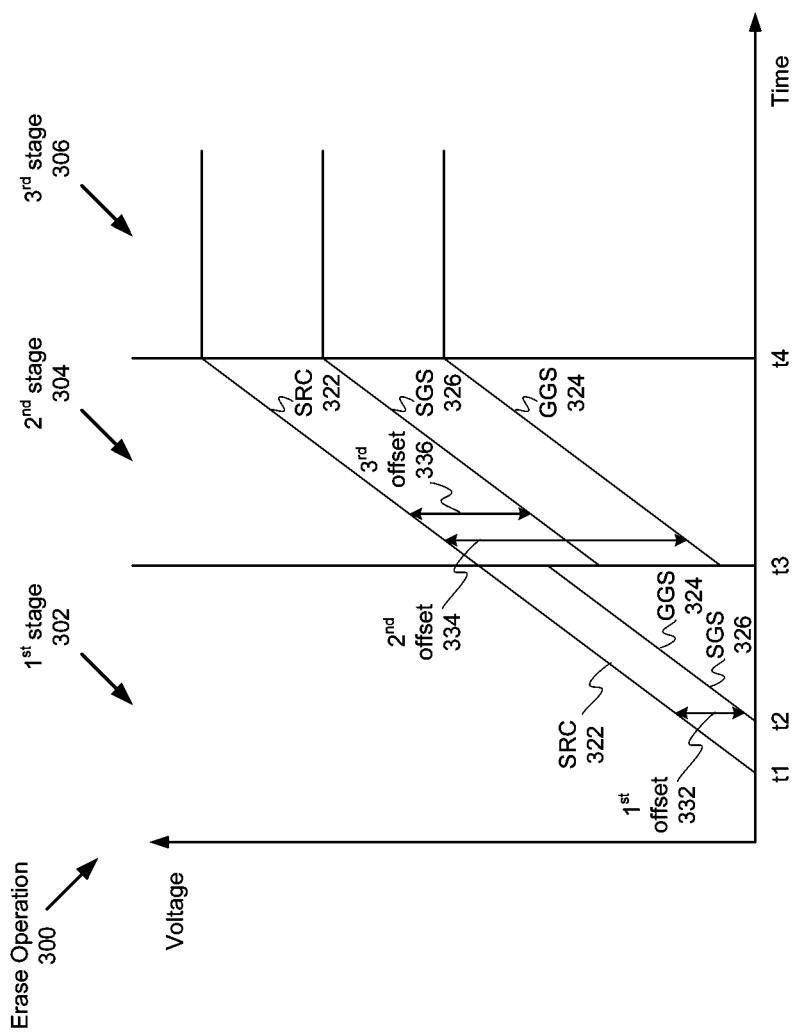
FIG. 3 is a graph illustrating voltage signals in a multi-stage erase operation in a memory device, in accordance with some embodiments of the present disclosure.

FIG. 3 is a graph illustrating voltage signals in a multi-stage erase operation 300 in a memory device, in accordance with some embodiments of the present disclosure. In one embodiment, the multi-stage erase operation 300 includes two or more stages, such as a first stage 302, a second stage 304, and a third stage 306. In other embodiments, the multi-stage erase operation 300 can include some other number of stages such as more or fewer stages. During each of the multiple stages of the multi-stage erase operation 300, various voltage signals are applied to various inputs, such as devices or terminals in a string of memory cells, such as string 200, in a memory device, such as memory device 130. As illustrated, the magnitudes and relative offsets of these voltage signals to one another can vary from one stage to the next so as to mitigate certain negative effects associated with the erase operation.

In one embodiment, an erase voltage signal 322 is applied to a source (SRC) terminal, such as common source 226, of string 200. In addition, a first voltage signal 324 is applied to a first device, such as GIDL generator device (e.g., GGS 210) at a source-end of the string 200 and a second voltage signal 326 is applied to a second device, such as select gate device (e.g., SGS 220), at the source-end of the string 200. As illustrated in FIG. 3, during the first stage 302 of erase operation 300, the erase voltage signal 322 begins ramping up at a first time t1 and both the first voltage signal 324 and the second voltage signal 326 begin ramping up at a second time t2. The second time t2 can be determined as the time at which the erase voltage signal 322 reaches a certain voltage level. In this embodiment, both the first voltage signal 324 and the second voltage signal 326 have a same offset (i.e., first offset 332) relative to the erase voltage signal 322. Each of the erase voltage signal 322 and the first and second voltage signals 324, 326 continue ramping up until the end of the first stage 302. In one embodiment, the first stage 302 ends and the second stage 304 begins at a third time t3. Depending on the embodiment, the third time t3 can be a time when the erase voltage signal 322 has reached a predetermined voltage level, or when a predetermined period of time has elapsed since the erase voltage signal 322 was applied to the source terminal of the string of memory cells (i.e., since the first time t1).

Since both the first voltage 324 applied to the GIDL generator device and the second voltage 326 applied to the select gate device have the same first offset 332 relative to the erase voltage 322 during the first stage 302 of the multi-stage erase operation 300, and since that first offset 332 is relatively low, a relatively small electrostatic field is formed at the source-end of the memory string 200. The small electrostatic field results in reduced trap-up effect (i.e., fewer trapped electrons) during the first stage 302.

During the second stage 304 of the multi-stage erase operation 300, the first and second voltage signals 324, 326 are reduced by respective amounts. For example, a voltage level of the first voltage signal 324 can be reduced by a first amount at the third time t3, and a voltage level of the second voltage signal 326 can be reduced by a second amount at the third time t3. As a result, the first voltage signal 324 has a second offset 334 with respect to the erase voltage signal 322 and the second voltage signal 336 has a third offset 336 with respect to the erase voltage signal 322 during the second stage 304. In one embodiment, the second offset 334 between the first voltage signal 324 and the erase voltage signal 322 is larger than the third offset 336 between the second voltage signal 326 and the erase voltage signal 322, and both the second offset 334 and the third offset 336 are larger than the first offset 332 used in the first stage 302.

Since the second offset 334 between the first voltage signal 324 and the erase voltage signal 322 and the third offset 336 between the second voltage signal 326 and the erase voltage signal 322 are both larger in the second stage 304 (due to the decrease at time t3), the electrostatic field at the source end of the memory string 200 increases, thereby allowing the GIDL generator device to generate holes for the erase operation 300. Thus, even as the number of program/erase cycles increase, the trap-up effects do not impact performance in the memory device as they are not present until the second stage 304 of the erase operation 300.

Each of the erase voltage signal 322 and the first and second voltage signals 324, 326 continue ramping up until the end of the second stage 304. In one embodiment, the second stage 304 ends and the third stage 306 begins at a fourth time t4. Depending on the embodiment, the fourth time t4 can be a time when the erase voltage signal 322 has reached a predetermined voltage level, or when a predetermined period of time has elapsed since the erase voltage signal 322 was applied to the source terminal of the string of memory cells (i.e., since the first time t1) or since the second stage 304 began (i.e., since the third time t3). During the third stage 306 the erase voltage signal 322 and the first and second voltage signals 324, 326 level off at respective constant voltages for the remainder of the erase operation 300.

Figure 4:
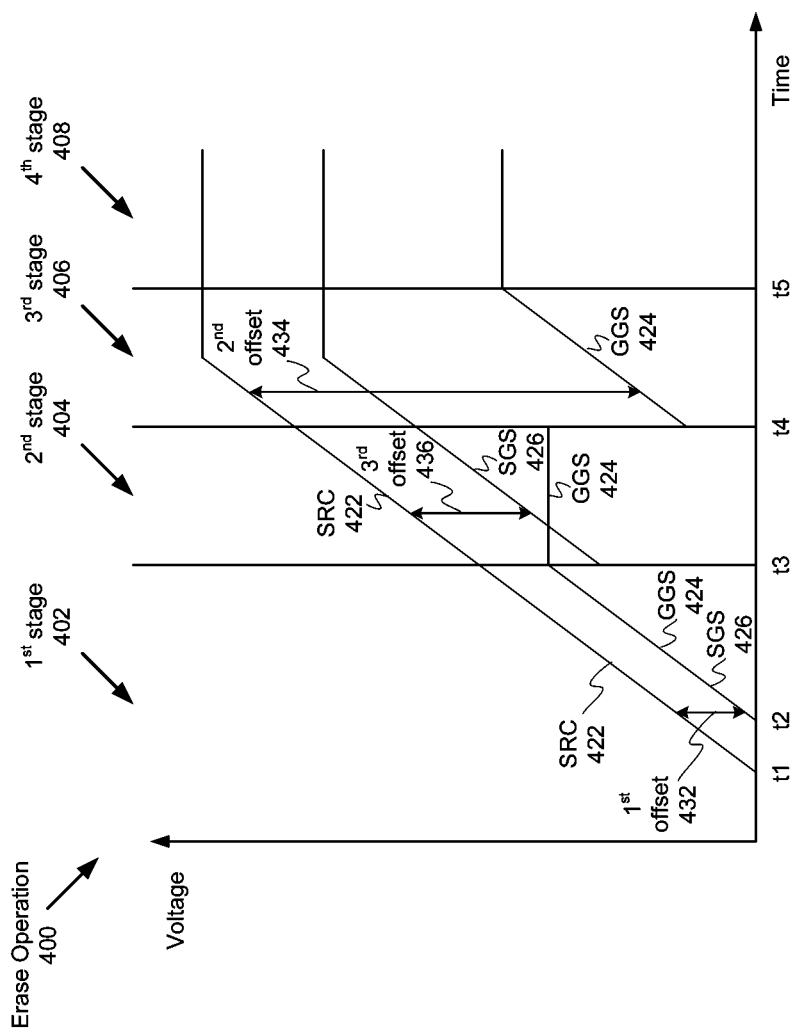
FIG. 4 is a graph illustrating voltage signals in a multi-stage erase operation in a memory device, in accordance with some embodiments of the present disclosure.

FIG. 4 is a graph illustrating voltage signals in a multi-stage erase operation 400 in a memory device, in accordance with some embodiments of the present disclosure. In one embodiment, the multi-stage erase operation 400 includes two or more stages, such as a first stage 402, a second stage 404, a third stage 406, and a fourth stage 408. In other embodiments, the multi-stage erase operation 400 can include some other number of stages such as more or fewer stages. During each of the multiple stages of the multi-stage erase operation 400, various voltage signals are applied to various inputs, such as devices or terminals in a string of memory cells, such as string 200, in a memory device, such as memory device 130. As illustrated, the magnitudes and relative offsets of these voltage signals to one another can vary from one stage to the next so as to mitigate certain negative effects associated with the erase operation.

In one embodiment, an erase voltage signal 422 is applied to a source (SRC) terminal, such as common source 226, of string 200. In addition, a first voltage signal 424 is applied to a first device, such as GIDL generator device (e.g., GGS 210) at a source-end of the string 200 and a second voltage signal 426 is applied to a second device, such as a select gate device (e.g., SGS 220), at the source-end of the string 200. As illustrated in FIG. 4, during the first stage 402 of erase operation 400, the erase voltage signal 422 begins ramping up at a first time t1 and both the first voltage signal 424 and the second voltage signal 426 begin ramping up at a second time t2. The second time t2 can be determined as the time at which the erase voltage signal 422 reaches a certain voltage level. In this embodiment, both the first voltage signal 424 and the second voltage signal 426 have a same offset (i.e., first offset 432) relative to the erase voltage signal 422. Each of the erase voltage signal 422 and the first and second voltage signals 424, 426 continue ramping up until the end of the first stage 402. In one embodiment, the first stage 402 ends and the second stage 404 begins at a third time t3. Depending on the embodiment, the third time t3 can be a time when the erase voltage signal 422 has reached a predetermined voltage level, or when a predetermined period of time has elapsed since the erase voltage signal 422 was applied to the source terminal of the string of memory cells (i.e., since the first time t1).

Since both the first voltage 424 applied to the GIDL generator device and the second voltage 426 applied to the select gate device have the same first offset 432 relative to the erase voltage 422 during the first stage 402 of the multi-stage erase operation 400, and since that first offset 432 is relatively low, a relatively small electrostatic field is formed at the source-end of the memory string 200. The small electrostatic field results in reduced trap-up effect (i.e., fewer trapped electrons) during the first stage 402.

During the second stage 404 of the multi-stage erase operation 400, the first voltage signal 424 remains at a constant voltage level while the second voltage signal 426 is reduced by a certain amount. For example, a voltage level of the second voltage signal 426 can be reduced by a certain amount at the third time t3. As a result, the second voltage signal 426 has a third offset 436 with respect to the erase voltage signal 422 during the second stage 404. The second voltage signals 426 continues ramping up until the end of the second stage 404. In one embodiment, the second stage 404 ends and the third stage 406 begins at a fourth time t4. Depending on the embodiment, the fourth time t4 can be a time when the erase voltage signal 422 has reached a predetermined voltage level, or when a predetermined period of time has elapsed since the erase voltage signal 422 was applied to the source terminal of the string of memory cells (i.e., since the first time t1) or since the second stage 404 began (i.e., since the third time t3).

During the third stage 406 of the multi-stage erase operation 400, the first voltage signal 424 is reduced by a certain amount. For example, a voltage level of the first voltage signal 424 can be reduced by a certain amount at the fourth time t4. As a result, the first voltage signal 424 has a second offset 434 with respect to the erase voltage signal 422 during the third stage 406. Thus, the first voltage signal 424 is caused to decrease to the second offset 434 with respect to the erase voltage 422 after a first delay period occurring after a beginning of the second stage 404 of the erase operation 400 (i.e., since the third time t3). In one embodiment, the second offset 434 between the first voltage signal 424 and the erase voltage signal 422 is larger than the third offset 436 between the second voltage signal 426 and the erase voltage signal 422, and both the second offset 434 and the third offset 436 are larger than the first offset 432 used in the first stage 402.

Since the second offset 434 between the first voltage signal 424 and the erase voltage signal 422 and the third offset 436 between the second voltage signal 426 and the erase voltage signal 422 are both larger in the second stage 404 (due to the decrease at time t3), the electrostatic field at the source end of the memory string 200 increases, thereby allowing the GIDL generator device to generate holes for the erase operation 400. Thus, even as the number of program/erase cycles increase, the trap-up effects do not impact performance in the memory device as they are not present until the second stage 404 of the erase operation 400.

Each of the erase voltage signal 422 and the first and second voltage signals 424, 426 continue ramping up until the end of the third stage 406. In one embodiment, the third stage 406 ends and the fourth stage 408 begins at a fifth time t5. Depending on the embodiment, the fifth time t5 can be a time when the erase voltage signal 422 has reached a predetermined voltage level, or when a predetermined period of time has elapsed since the erase voltage signal 422 was applied to the source terminal of the string of memory cells (i.e., since the first time t1) or since the second stage 404 began (i.e., since the third time t3). During the fourth stage 408 the erase voltage signal 422 and the first and second voltage signals 424, 426 level off at respective constant voltages for the remainder of the erase operation 400.

Figure 5:
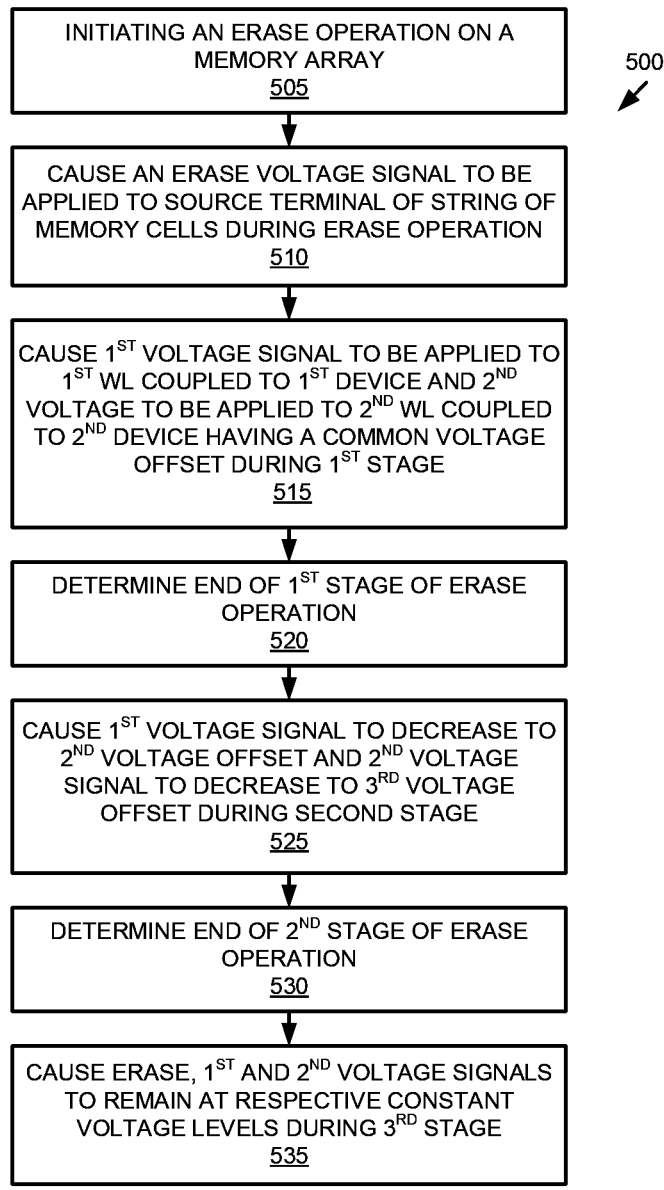
FIG. 5 is a flow diagram of an example method of implementing a multi-stage erase operation in a memory device, in accordance with some embodiments of the present disclosure.

FIG. 5 is a flow diagram of an example method of implementing a multi-stage erase operation in a memory device, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by access management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a memory access operation is initiated. For example, a component in memory sub-system 110 (e.g. processor 117, memory sub-system controller 115 or local media controller 135) can send a request to perform an erase operation on a memory device (e.g., memory device 130). In one embodiment, access management component 113 receives the request to perform the erase operation on the memory device 130. In response, access management component 113 can initiate the memory access operation, such as for a block of memory device 130 including one or more memory strings, such as string 200.

At operation 510, an erase voltage signal is applied. For example, the processing logic can cause a voltage signal, such as an erase voltage signal to be applied to a source terminal (e.g., common source 226) of string 200 allowing electrons stored in the channel region to flow out, thereby reducing the stored charge and erasing the memory.

At operation 515, additional voltage signals are applied. For example, the processing logic can cause voltage signals, such as a first voltage signal to be applied to a first select line coupled to a GIDL generator device (e.g., GGS 210) at a source-end of the string 200 and a second voltage signal to be applied to a second select line coupled to select gate device (e.g., SGS 220) at the source-end of the string 200. In one embodiment, the first and second voltage signals are the same during the first stage of the erase operation, and thus have a same first offset relative to the erase voltage signal (i.e., the first and second voltage signals both begin ramping up at the same rate when the erase voltage signal reaches a certain level). Each of the erase voltage signal and the first and second voltage signals continue ramping up until the access management component 113 detects the end of the first stage.

At operation 520, the end of a stage is determined. For example, the processing logic can determine the end of the first stage of the erase operation. In one embodiment, access management component 113 determines the end of the first stage of the erase operation by determining that the erase voltage signal has reached a predetermined voltage level. In another embodiment, access management component 113 determines the end of the first stage of the erase operation by determining that a predetermined period of time has elapsed since the erase voltage signal was applied to the source terminal of the string of memory cells.

At operation 525, voltage signals are decreased. For example, the processing logic can decrease the first and second voltage signals during the second stage of the memory operation. In one embodiment, when reduced, the first voltage signal applied to the GIDL generator device (e.g., GGS 210) has a second offset with respect to the erase voltage signal and the second voltage signal applied to the select gate device (e.g. SGS 220) has a third offset with respect to the erase voltage signal. In one embodiment, the second offset between the first voltage signal and the erase voltage signal is larger than the third offset between the second voltage signal and the erase voltage signal, and both the second offset and the third offset are larger than the first offset used in the first stage.

At operation 530, the end of a stage is determined. For example, the processing logic can determine the end of the second stage of the erase operation. In one embodiment, access management component 113 determines the end of the second stage of the erase operation by determining that the erase voltage signal has reached a predetermined voltage level. In another embodiment, access management component 113 determines the end of the second stage of the erase operation by determining that a predetermined period of time has elapsed since the erase voltage signal was applied to the source terminal of the string of memory cells.

At operation 535, voltage signals are leveled off. For example, the processing logic can during a third stage of the erase operation, access management component 113 causes the erase voltage signal and the first and second voltage signals to level off at respective constant voltages for the remainder of the erase operation.

Figure 6:
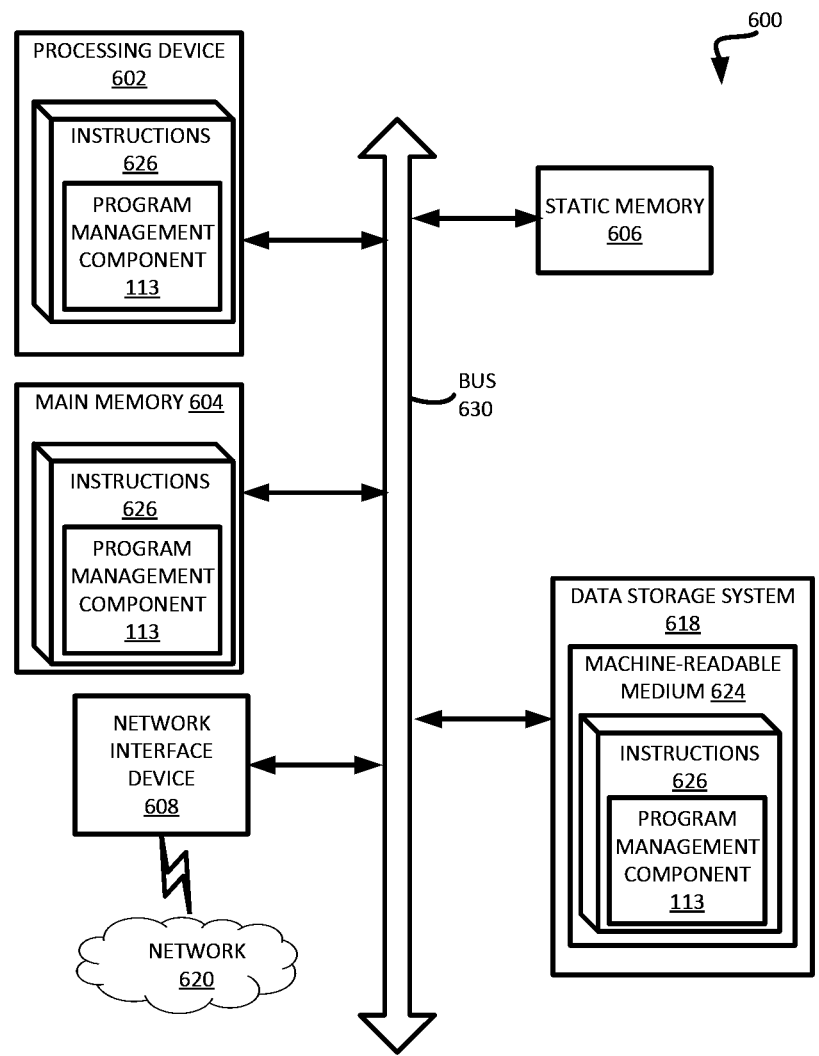
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the access management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the access management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array; and
   control logic, operatively coupled with the memory array, to perform operations comprising:
   initiating an erase operation on the memory array;
   causing an erase voltage signal to be applied to a source terminal of a string of memory cells in a data block of the memory array during the erase operation;
   causing a first voltage signal to be applied to a first select line of the data block and a second voltage signal to be applied to a second select line of the data block, wherein the first select line is coupled to a first device in the string of memory cells and the second select line is coupled to a second device in the string of memory cells, and wherein the first voltage signal and the second voltage signal both have a common first voltage offset with respect to the erase voltage signal during a first stage of the erase operation;
   determining an end of the first stage of the erase operation; and
   causing the first voltage signal to decrease to a second voltage offset with respect to the erase voltage signal and causing the second voltage signal to decrease to a third voltage offset with respect to the erase voltage signal during a second stage of the erase operation, wherein the second offset is greater than the third offset.

2. The memory device of claim 1, wherein the first device comprises a gate induced drain leakage (GIDL) generator device.

3. The memory device of claim 1, wherein the second device comprises a select gate device.

4. The memory device of claim 1, wherein determining the end of the first stage of the erase operation comprises determining that the erase voltage signal has reached a predetermined voltage level.

5. The memory device of claim 1, wherein determining the end of the first stage of the erase operation comprises determining that a predetermined period of time has elapsed since the erase voltage signal was applied to the source terminal of the string of memory cells.

6. The memory device of claim 1, wherein the first voltage signal is caused to decrease to the second voltage offset with respect to the erase voltage signal and the second voltage signal is caused to decrease to the third voltage offset with respect to the erase voltage signal at a beginning of the second stage of the erase operation.

7. The memory device of claim 1, wherein the first voltage signal is caused to decrease to the second voltage offset with respect to the erase voltage signal after a first delay period occurring after a beginning of the second stage of the erase operation, and wherein the second voltage signal is caused to decrease to the third voltage offset with respect to the erase voltage signal at the beginning of the second stage of the erase operation.

8. The memory device of claim 1, wherein the control logic to perform further operations comprising:
   determining an end of the second stage of the erase operation; and causing the erase voltage signal, the first voltage signal, and the second voltage signal to remain at respective constant voltage levels during a third stage of the erase operation.

9. A method comprising:
initiating an erase operation on a memory array;
causing an erase voltage signal to be applied to a source terminal of a string of memory cells in a data block of the memory array during the erase operation;
causing a first voltage signal to be applied to a first select line of the data block and a second voltage signal to be applied to a second select line of the data block, wherein the first select line is coupled to a first device in the string of memory cells and the second select line is coupled to a second device in the string of memory cells, and wherein the first voltage signal and the second voltage signal both have a common first voltage offset with respect to the erase voltage signal during a first stage of the erase operation;
determining an end of the first stage of the erase operation; and
causing the first voltage signal to decrease to a second voltage offset with respect to the erase voltage signal and causing the second voltage signal to decrease to a third voltage offset with respect to the erase voltage signal during a second stage of the erase operation, wherein the second offset is greater than the third offset.

10. The method of claim 9, wherein the first device comprises a gate induced drain leakage (GIDL) generator device.

11. The method of claim 9, wherein the second device comprises a select gate device.

12. The method of claim 9, wherein determining the end of the first stage of the erase operation comprises determining that the erase voltage signal has reached a predetermined voltage level.

13. The method of claim 9, wherein determining the end of the first stage of the erase operation comprises determining that a predetermined period of time has elapsed since the erase voltage signal was applied to the source terminal of the string of memory cells.

14. The method of claim 9, wherein the first voltage signal is caused to decrease to the second voltage offset with respect to the erase voltage signal and the second voltage signal is caused to decrease to the third voltage offset with respect to the erase voltage signal at a beginning of the second stage of the erase operation.

15. The method of claim 9, wherein the first voltage signal is caused to decrease to the second voltage offset with respect to the erase voltage signal after a first delay period occurring after a beginning of the second stage of the erase operation, and wherein the second voltage signal is caused to decrease to the third voltage offset with respect to the erase voltage signal at the beginning of the second stage of the erase operation.

16. The method of claim 9, further comprising:
determining an end of the second stage of the erase operation; and
causing the erase voltage signal, the first voltage signal, and the second voltage signal to remain at respective constant voltage levels during a third stage of the erase operation.

17. A memory device comprising:
a first string of memory cells in a block of memory cells, wherein the first string of memory cells comprises a source terminal, a gate induced drain leakage (GIDL) generator device, a select gate device, and a plurality of memory cells, wherein the GIDL generator device, the select gate device, and the plurality of memory cells are coupled to a plurality of signal lines;
wherein the source terminal is configured to receive an erase voltage signal during a multi-stage erase operation;
wherein a first signal line of the plurality of signal lines is coupled to the GIDL generator device and is configured to receive a first voltage signal, wherein a second signal line of the plurality of signal lines is coupled to the select gate device and is configured to receive a second voltage signal;
wherein the first voltage signal and the second voltage signal both have a common first voltage offset with respect to the erase voltage signal during a first stage of the multi-stage erase operation; and
wherein the first voltage signal decreases to a second voltage offset with respect to the erase voltage signal and the second voltage signal decreases to a third voltage offset with respect to the erase voltage signal during a second stage of the multi-stage erase operation, wherein the second offset is greater than the third offset.

18. The memory device of claim 1, wherein the first stage of the erase operation ends and the second stage of the erase operation begins when the erase voltage signal reaches a predetermined voltage level.

19. The memory device of claim 1, wherein the first stage of the erase operation ends and the second stage of the erase operation begins when a predetermined period of time elapses since the erase voltage signal was applied to the source terminal of the string of memory cells.

20. The memory device of claim 1, wherein the erase voltage signal, the first voltage signal, and the second voltage signal remain at respective constant voltage levels during a third stage of the multi-stage erase operation.

* * * * *